United States Patent [19]

Tanino et al.

[11] Patent Number: 5,106,687
[45] Date of Patent: Apr. 21, 1992

[54] COMPOSITE MATERIAL WITH CHEMICALLY VAPOR DEPOSITED LAYER OF SILICON CARBIDE FORMED THEREON

[75] Inventors: Kichiya Tanino; Yasuhiro Akune, both of Hyogo, Japan

[73] Assignee: Nippon Pillar Packing Co., Ltd., Osaka, Japan

[21] Appl. No.: 672,907

[22] Filed: Mar. 21, 1991

[51] Int. Cl.$^5$ ............................................. B32B 33/00
[52] U.S. Cl. .................................... 428/141; 427/249; 427/255; 428/408; 428/409; 428/446; 428/698
[58] Field of Search ............... 128/408, 446, 698, 409, 128/141; 427/249, 255

[56] References Cited

U.S. PATENT DOCUMENTS

| | | | |
|---|---|---|---|
| 4,608,326 | 8/1986 | Neukermans et al. | 428/698 |
| 4,634,635 | 1/1987 | Shiraishi et al. | 428/698 |
| 4,783,368 | 11/1988 | Yamamoto et al. | 428/408 |
| 4,843,040 | 6/1989 | Oda et al. | 428/446 |
| 4,941,942 | 7/1990 | Bruns et al. | 430/5 |

Primary Examiner—Ellis P. Robinson
Assistant Examiner—Archene Turner
Attorney, Agent, or Firm—Griffin, Branigan & Butler

[57] ABSTRACT

A composite material for use as a construction material for high energy density beam reflectors and for other purposes, comprising a substrate and a chemically vapor deposited layer of silicon carbide formed thereon, wherein the crystal faces in said chemically vapor deposited layer of silicon carbide are oriented to the (220) plane as indicated by Miller indices.

6 Claims, 3 Drawing Sheets

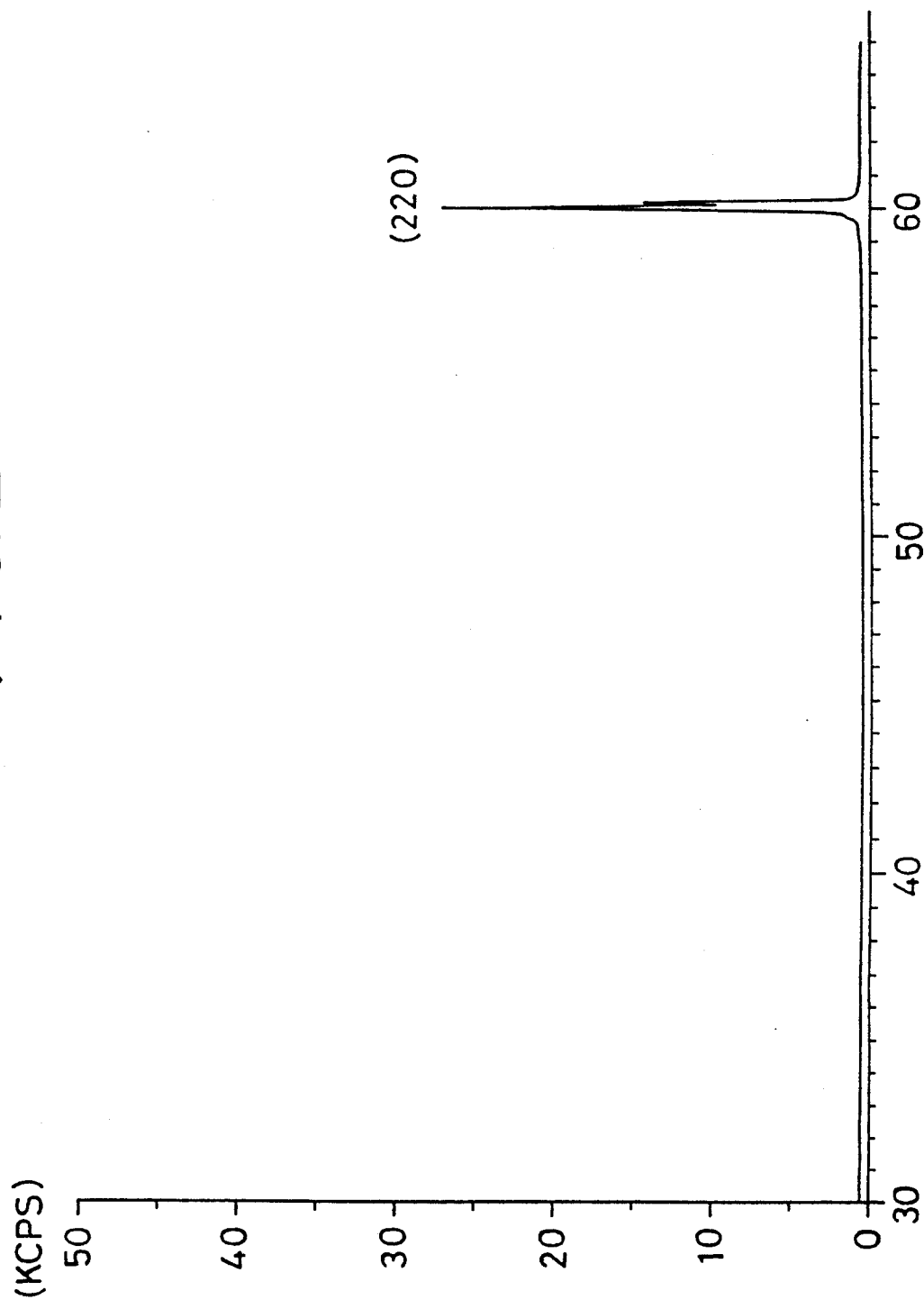

COMPOSITE MATERIAL WITH CHEMICALLY VAPOR DEPOSITED LAYER OF SILICON CARBIDE FORMED THEREON

FIELD OF THE INVENTION

The present invention relates to a composite material which is suitably used as a construction material for high energy density beam reflectors such as high output laser reflectors, X-ray laser reflectors and Synchrotron Radiation beam reflectors and for other purposes, and which comprises a substrate and a chemically vapor deposited layer of silicon carbide formed thereon.

PRIOR ART

Generally, well-known laser reflectors include those constructed by mirror polishing a substrate of copper or another material and vapor depositing gold thereon and those constructed by coating on a substrate a multilayer film having a thickness calculated and designed from the service wavelength to utilize its interfering effect. Such laser reflectors, however, are apt to undergo separation, distortion, damages caused by heat and other mirror surface failures when involving high energy density beam in the short wavelength band, such as vacuum ultraviolet radiation or soft X-ray, which failures are very difficult to overcome, though this does not apply to cases where they are used for relatively low energy density beam in the long wavelength band, such as visible light or infrared radiation.

In recent years, laser reflectors made of a composite material comprising a substrate of sintered silicon carbide or carbon and high purity silicon carbide chemically vapor deposited thereon have been developed as highly promising laser reflectors free of the drawback described above. Accordingly, this type of laser reflectors is made by surface polishing a chemically vapor deposited layer of silicon carbide (CVD-SiC) to a super-smooth surface (RMS not exceeding 10 Å). CVD-SiC does not cause the drawback described above even when involving high energy density light in the short wavelength band because it is excellent both in physical properties such as thermal resistance, thermal conductivity and toughness and in optical properties such as high reflectance in the excimer laser wavelength band.

As stated above, the composite material described above has a surface layer which is excellent in thermal resistance, thermal conductivity, toughness and other properties; therefore, it serves very well as a construction material for high energy density beam reflectors and for other purposes.

On the other hand, conventional composite materials require a great deal of labor for surface polishing to a super-smooth surface as described above, because high purity CVD-SiC is generally highly crystalline and extremely hard. Moreover, their requirement for extremely high polishing energy tends to result in polished surface damage, thus making it difficult to obtain a smooth surface with high precision.

SUMMARY OF THE INVENTION

Through various experiments and investigations the present inventor elucidated that the difficulty in surface polishing in conventional composite materials is due to the lack of orientation of the crystal faces in the vapor deposited layer of silicon carbide. The inventor made further experiments and investigations, and found that it is possible to surface polishing to a super-smooth surface with less polishing energy while minimizing the occurrence of surface damage by orienting the crystal faces in the vapor deposited layer of silicon carbide in a given direction and uniformizing the cleavage planes.

The present invention was developed on the basis of these findings. It is an object of the invention to provide a composite material which permits easy and high precision surface polishing of a chemically vapor deposited layer of silicon carbide.

In other words, the composite material of the present invention permits very easy surface polishing with less polishing energy in comparison with conventional composite materials, and makes it possible to obtain a smooth surface with high precision while minimizing the damage on the polished surface. Accordingly, the present invention provides a composite material which is highly practical for use as a construction material for high energy density beam reflectors and for other purposes.

The object of the present invention described above can be accomplished by orienting the crystal faces in the chemically vapor deposited layer of silicon carbide to the (220) plane as indicated by Miller indices.

Specifically, this composite material is obtained by chemically vapor depositing high purity $\beta$ silicon carbide on the surface of a substrate, wherein vapor deposition is carried out so that the (111) and other planes as indicated by Miller indices are oriented to the (220) plane. In this case, it is preferable to make the X-ray diffraction intensity ratio of the (220) plane to the (111) and other planes exceed 99 as the peak intensity. Vapor deposition is preferably carried out, for example, at a vapor deposition temperature of 1300° to 1500° C., at a vapor deposition rate of 10 to a few dozen $\mu$m/h and in a non-oxidizing atmosphere. Although any material such as carbon can be selected for use as the construction material for the substrate, sintered silicon carbide is preferred from the viewpoint of full utilization of the essential characteristics of CVD-SiC.

Other objects, features, aspects and advantages of the present invention will become apparent upon consideration of the following detailed description of the invention when taken in conjunction with the accompanying drawings.

BRIEF DESCRIPTION OF THE DRAWINGS

FIG. 2 is an X-ray diffraction pattern diagram of the composite material of the present invention.

DETAILED DESCRIPTION OF THE INVENTION

Figure 1:
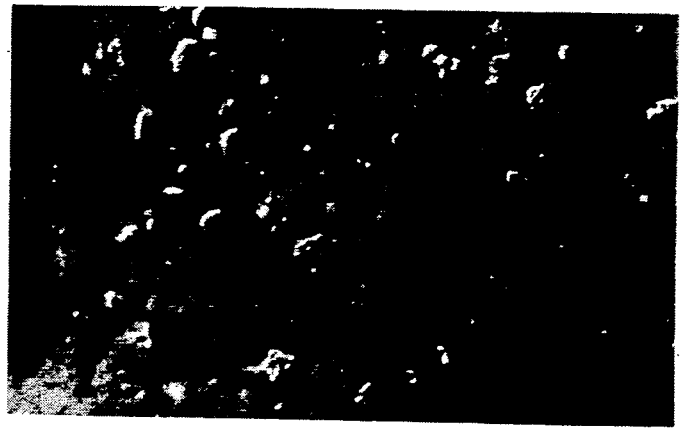
FIG. 1 is a Nomarski micrograph showing a magnified view (x 800) of the surface of the composite material of the present invention.

A composite material showing the surface morphology and X-ray diffraction pattern given in FIGS. 1 and 2, respectively, was obtained by chemically vapor depositing pure $\beta$ silicon carbide on the surface of a substrate of sintered silicon carbide while controlling the vapor deposition. Vapor deposition was carried out in a non-oxidizing atmosphere at a vapor deposition temperature of 1350° C.

In the composite material of this working example, the crystal faces in the vapor deposited layer of silicon carbide are forced to orient to the (220) plane, as shown in FIGS. 1 and 2. FIG. 1 is a Nomarski micrograph showing a magnified view (x 800) of the surface of the vapor deposited layer, wherein the projected region is the (111) plane. FIG. 2 is an X-ray diffraction pattern (CUK$\alpha$: 30 KV×30 mA, full scale: 50 KCPS, slit: 1-1-0.3, 2$\theta$: 2°/min, chart speed: 20 mm/min, main peak intensity: 27 KCPS) of the vapor deposited layer of silicon carbide. As is evident from this pattern diagram, the X-ray diffraction intensity ratio of the (220) plane to the (111) and other planes exceeds 99 as the peak intensity.

Figure 3:
FIG. 3 is a Nomarski micrograph showing a magnified view (x 800) of the surface of a conventional composite material.
Figure 4:
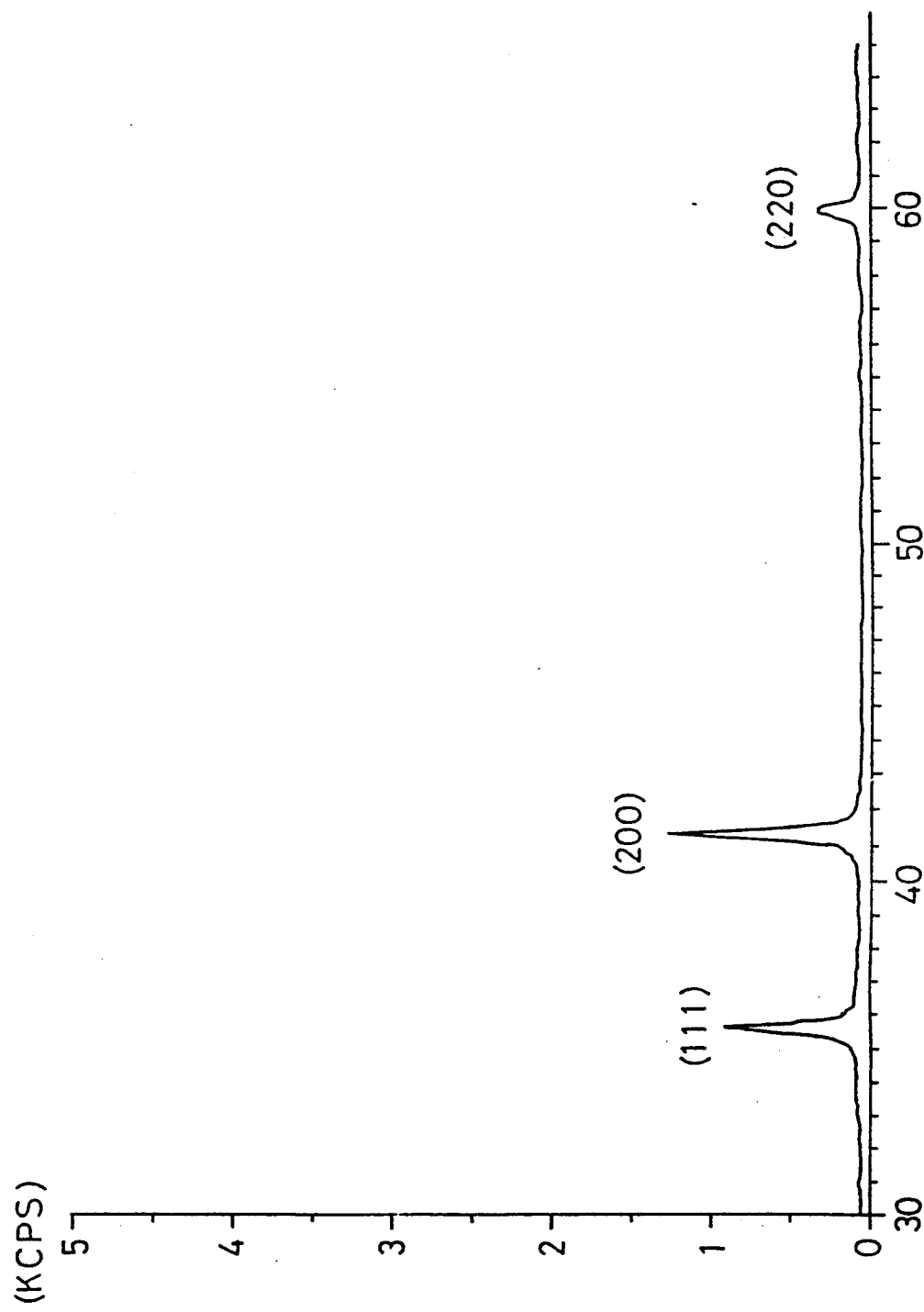
FIG. 4 is an X-ray diffraction pattern diagram of the conventional complex material.

For a comparative example, another composite material was prepared in the same manner as in the working example above except that different vapor deposition conditions were used. This composite material showed the surface morphology and diffraction pattern (CUK$\alpha$: 30 KV×30 mA, full scale: 50 KCPS, slit: 1-1-0.3, 2$\theta$: 2°/min, chart speed: 20 mm/min, main peak intensity: 1.2 KCPS) given in FIGS. 3 and 4, respectively. This composite material is conventionally known as a construction material for laser reflectors. The crystal faces in the vapor deposited layer of silicon carbide of this composite material were found not to be oriented, as shown in FIGS. 3 and 4.

In addition, these two composite materials were compared as to physical properties and optical properties in the surface region and surface polishing property. There was a distinct difference in surface polishing property, though no difference was noted in physical properties such as thermal resistance or in optical properties such as reflectance in the excimer laser wavelength band. Specifically, the composite material of the working example required only a very small amount of labor, including polishing energy and polishing time, to reach a given degree of smoothness (RMS not exceeding 10 Å), while that of the comparative example required much labor and high polishing energy as stated above. Furthermore, the composite material of the working example had almost no damage on the polished surface because of the low polishing energy, while that of the comparative example had distinct damage on the polished surface.

A similar test of surface polishing property was carried out on samples wherein the crystal faces in the vapor deposited layer of silicon carbide are oriented to a plane other than the (220) plane, but no effect was obtained as seen in the working example above.

The embodiments of the invention in which an exclusive property or privilege is claimed are defined as follows.

1. In a composite material comprising a sintered silicon carbide substrate capable of adhering and having thereon a layer of chemically vapor deposited beta silicon carbide, with silicon carbide crystal faces in said layer, the improvement wherein the crystal faces are oriented to the (220) plane as indicated by Miller indices.

2. A composite material of claim 1 wherein the X-ray diffraction intensity ratio of the (220) plane to the (111) and other planes in the chemically vapor deposited layer of silicon carbide exceeds 99 as the peak intensity.

3. A composite material of claim 1 for use as a construction material for high energy density beam reflectors.

4. A composite material of claim 3 wherein the reflectors are high output laser reflectors, X-ray laser reflectors and synchrotron radiation beam reflectors.

5. A composite material of claim 1 wherein the silicon carbide layer is polished to a high surface polish.

6. A composite material of claim 5 wherein the polishing is to a smoothness of RMS not exceeding 10 Å.

* * * * *